United States Patent [19]

Golovchenko et al.

[11] 4,154,625
[45] May 15, 1979

[54] ANNEALING OF UNCAPPED COMPOUND SEMICONDUCTOR MATERIALS BY PULSED ENERGY DEPOSITION

[75] Inventors: Jene A. Golovchenko, Basking Ridge; Thirumalai N. C. Venkatesan, Highland Park, both of N.J.

[73] Assignee: Bell Telephone Laboratories, Incorporated, Murray Hill, N.J.

[21] Appl. No.: 851,846

[22] Filed: Nov. 16, 1977

[51] Int. Cl.$^2$ .................... H01L 21/268; H01L 21/26
[52] U.S. Cl. .................... 148/1.5; 148/175; 219/121 L; 357/18; 357/91
[58] Field of Search .................... 357/18, 91; 148/175, 148/1.5; 219/121 L

[56] References Cited

U.S. PATENT DOCUMENTS

| | | | |
|---|---|---|---|
| 3,585,088 | 6/1971 | Schwuttle et al. | 148/174 |
| 3,940,289 | 2/1976 | Marquardt et al. | 148/1.5 |
| 4,059,461 | 11/1977 | Fan et al. | 148/1.5 |
| 4,070,205 | 1/1978 | Rahilly | 136/89 SJ |

OTHER PUBLICATIONS

Kachurin et al., "Annealing ... Defects ... Laser ...," Sov. Phys. Semicond. 9, (1976), 946.
Bolotov et al., "Laser Annealing ... in ... GaAs," Sov. Phys. Semicond. 10, (1976), 338.
Kachurin et al., "Annealing ... Laser Beam," Sov. Phys. Semicond. 10, (1976), 1128.
Bogatyrev et al., "Implanted ... GaAs ... Laser ...," Sov. Phys. Semicond. 10, (1976), 826.
Bhatia et al., "Isolation Process ...," IBM-TDB, 19, (1977), 4171.
Kutukova et al., "Laser Annealing ... Si," Sov. Phys. Semicond., 10, (1976), 265.
Cuomo et al., "Amorphous ... Solar Cell and Laser," IBM-TDB, 20, (1977), 2061.
Westermorland et al., "Lattice Disorder ... GaAs ...," Radiation Effects, 5, (1970), 245.

*Primary Examiner*—L. Dewayne Rutledge
*Assistant Examiner*—Upendra Roy
*Attorney, Agent, or Firm*—Peter V. D. Wilde

[57] ABSTRACT

Damaged semiconductor materials are annealed using localized short term energy deposition. In a specific embodiment gallium arsenide damaged during ion implantation is annealed by exposure to short laser pulses.

33 Claims, 2 Drawing Figures

ANNEALING OF UNCAPPED COMPOUND SEMICONDUCTOR MATERIALS BY PULSED ENERGY DEPOSITION

BACKGROUND OF THE INVENTION

1. Field of the Invention

This invention relates to the annealing of compound semiconductor materials and more specifically to the laser annealing of such materials using short term energy deposition.

2. Description of the Prior Art

Semiconductor devices generally require materials which are doped with appropriate elements in order to yield useful electrical properties. Numerous techniques are available for the fabrication of such doped semiconductor materials. Among such techniques are liquid and vapor phase epitaxial growth, diffusion, and ion implantation. The ion implantation technique has specific advantages in that the dopant levels may be more reproducibly controlled with regard to concentration, purity and physical location. However, it is found that the implantation process seriously damages the crystal structure of the semiconductor material, resulting in significant deterioration of its electrical properties. Currently such damage is "annealed" by heating the implanted material, typically to values in excess of one half of its melting point temperature, for periods ranging from minutes to hours. Such annealing processes improve the electrical properties of the material. It is believed that this improvement may be associated with a readjustment of the semiconductor to a crystal state. However, useful electrical properties may be attained even though the final crystal state is not perfect.

Compound materials, such as gallium arsenide, present a specific problem when annealed using the prior art thermal processes. The relative ineffectiveness of such annealing processes, when applied to compound semiconductors, is believed to be associated with the difference in volatility between the various constituent elements of the compound semiconductor. For example, in a gallium arsenide substrate significant evaporation of arsenic, and even out-diffusion of some gallium, may occur during the heating required to anneal.

A recent development involves annealing of damaged crystals using short laser pulses (see, for example, *Soviet Physics Semiconductor*, Vol. 10, No. 3, March 1976, page 265 and references cited therein). Most of this work has been applied to the annealing of silicon. Additional work recorded in the Russian literature (*Soviet Physics Semiconductor*, Vol. 9, No. 7, page 946) indicates that the annealing process is effective when applied to compound semiconductors, such as gallium arsenide, as well. However, even annealing with short laser pulses was believed to result in significant loss of the constituent elements of the compound semiconductor, unless steps were taken to prevent such evaporative loss. This is demonstrated by the fact that the reported gallium arsenide experiments involve the utilization of a silicon nitride cap over the gallium arsenide surface in order to prevent evaporation during the annealing.

SUMMARY OF THE INVENTION

This invention involves annealing a damaged, uncapped compound semiconductor by means of a short term localized energy deposition. Applicants have shown that effective annealing of compound semiconductors may proceed without the loss of volatile constituent elements despite the fact that an evaporation preventing cap is not applied to the semiconductor substrate. A specific embodiment involves laser annealing of compound semiconductors damaged during ion implantation. Laser annealing, when applied to gallium arsenide yields structures with lower sheet resistivity than similar structures annealed using the prior art thermal process (e.g., ion implantation followed by the prior art thermal anneal). Furthermore, implantation may be performed at room temperatures and in air, rather than at the elevated temperatures and limited environments previously used with compound semiconductors, such as gallium arsenide, in order to make the thermal annealing process more effective.

DETAILED DESCRIPTION

Figure 1:
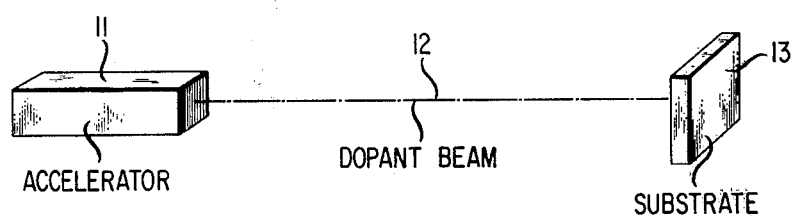
FIG. 1 is a schematic representation of an ion implantation device.

The invention is a process for annealing compound semiconductors (e.g., GaAs, InP, GaAlAs . . .) using short term energy deposition. It is believed that such energy deposition provides adequate mobility for the damaged structure to be reoriented, thereby yielding desirable electrical properties. Inherent in the invention is the realization that the process may proceed without the need for capping — required in the prior art to prevent loss of one or more of the material constituent or dopant elements during annealing.

THE SUBSTRATE

The material to which this process is applied is generally deficient in one or more electrical properties. The annealing process is utilized to bring one or more of these properties to an acceptable value. Generally the material, prior to annealing, will comprise a damaged crystal in which numerous defects exist. Specific prior art annealing processes may be addressed to the annealing of low density defects. However, this process is found effective even for high density defects and is generally envisioned for use on materials with extended defects, and more particularly for use on materials with a defect density in excess of $10^{17}$/cc. Specific embodiments involve materials with defect densities in excess of $10^{20}$/cc. While the material will generally be a damaged crystal the invention does not preclude the annealing of a totally amorphous material, perhaps deposited, so as to bring it to a crystal state (either single crystal or polycrystal). The term "damaged crystalline compound semiconductor" as used here includes such amorphous materials. The invention in its broad embodiment is not specifically concerned with the cause for the deficiency in the above-noted properties of the material, or with the extent of the crystal damage. However, a specific embodiment involves materials damaged during ion implantation to a defect density in excess of $10^{19}$/cc.

The compound semiconductors to which this invention applies finds wide use in electronics technology. Other annealing processes may be utilized to improve the properties of various materials of interest in other technologies. However, this invention involves materials which, subsequent to the annealing process, will have an electron mobility in excess of 10 cm$^2$/volt-sec., (usually in excess of 50 or even 200 cm$^2$/volt-sec. in devices relying on carrier transport) and is consequently envisioned for use in transistor, optical (e.g., laser diodes) or other semiconductor devices.

As mentioned above, prior art thermal processes when applied to compound semiconductors generally result in significant evaporation of one or more of the constituent elements of the material. This invention avoids such loss and consequently does not require additional steps such as capping which have heretofore been utilized to avoid such evaporation losses. The restriction of this invention to uncapped materials is not meant however to preclude material with native oxide layers that normally grow upon exposure of the material to ambient air. Such layers are generally less than one, or at most two hundred angstroms thick.

While the uncapped material used in this invention may exhibit some small evaporation loss, it does not interfere with the noted improvement in the electrical properties of the material. Specifically, in an ion implanted semiconductor the maximum evaporation loss is of the order of the amount of dopant material added to the semiconductor - generally between $10^{11}$ and $10^{17}$ atoms/cm$^2$. In typical applications this is greater than $10^{14}$ atoms/cm$^2$.

ENERGY DEPOSITION

As currently envisioned the annealing process proceeds as a result of a localized short term deposition of energy in the damaged crystal. The exact form that this energy takes is not critical as long as it yields the improvement noted. Exemplary energy forms include electron or ion beams, or electromagnetic energy in the form, for example, of laser beams or incoherent light beams. The electromagnetic energy will most often be in the "optical" range (3,000A–20,000A), encompassing both visible and infrared regions of the spectrum. The exposure of any given region of material however must be limited in time to avoid evaporation of volatile constituents—generally to times less than 10 milliseconds and usually to times greater than $10^{-9}$ sec. This short term exposure may be realized by either pulsing the source or by sweeping a cw source past a given region of the substrate material. The exposure time must, however, be long enough so that the reorientation necessary to improve the properties of the substrate can proceed before the material assumes a final form.

The size of the spot over which the energy is deposited, as well as the average power and duration of the pulse, may vary within the constraints established by the need to transfer sufficient energy to the substrate without deleterious evaporation effects—constraints which have been shown to be practical by applicants. The spot may be swept over the substrate to yield a desirable pattern with resolution greater than 10 $\mu$ and in specific embodiments with resolution greater than 2 $\mu$. The pattern may also be obtained by projecting an interference pattern onto the substrate.

Prior annealing processes may involve various techniques in addition to some type of energy deposition in order to yield a form of annealing. Such additional steps may include, for example, the application of various electric or magnetic fields to the substrate during the annealing process. While the application of such fields is not precluded by this invention, and certainly the material will at the very least be found in ambient electrical, magnetic and gravitational fields, such fields are not found necessary to the broad embodiments of this invention. In its broad embodiment this invention may be practiced in ambient air, at room temperatures and without the application of additional fields. Specific embodiments may include the application of external fields, and operation at elevated temperatures.

THE ANNEALING PROCESS

It is believed that during the short term deposition of energy to the substrate material the constituent elements are given an opportunity to reorient themselves to a crystal type structure. As such the region exposed to the energy deposition utilizes the nonexposed region as a template during the reorientation phenomenon. While in certain embodiments the exposed area will be rendered molten and will reform to a crystal state, all that is critical to this invention is that the annealing results in an improvement of the properties of the material to values which make the material practical for later use.

The physical model that includes a short period over which the substrate structure may freely reorient itself, helps to explain one unexpected result; namely, that the dopant concentration in the final structure may be as high as ten times the equilibrium solubility. The short time allowed for reorientation and subsequent rapid "quench" may help to explain this high concentration.

PULSE CHARACTERISTICS

The input of energy to the damaged crystalline material is advantageously accomplished within certain specific parameters. For example, the energy obviously must be in a form which will be efficiently absorbed by the substrate. However, it must be borne in mind that in a doped or damaged material, the absorption bands may vary somewhat from the undoped or undamaged state. As such, light, for example, with frequency below the apparent (i.e., crystal) band gap may still result in annealing. In addition absorption will depend not only on linear phenomena but, at the high powers generally required, will depend on nonlinear phenomena as well. Furthermore the concentration of dopant materials will also affect the power levels needed to anneal. Exemplary energy levels for a 10 ns, 4 mm spot range from 1 to 100 Megawatts/cm$^2$ and in specific embodiments will vary from 15 to 75 Megawatts/cm$^2$.

The application of energy to the substrate must be localized in time so that it is short enough to preclude significant evaporation of material constituents from the surface and yet long enough to allow for reorientation of the material constituents to yield an improved crystalline form. Within this constraint, however, the longer the application of energy the greater the depth to which the dopant can diffuse. The range of parameters which would satisfy the requirements of this invention depend at least upon the form and magnitude of the energy deposited and the specific composition and form of the substrate.

Applicants have demonstrated numerous advantages which inure to the practitioner of their invention. A number of these advantages are described below.

1. CONDUCTIVITY

The conductivity of a doped semiconductor implanted with dopant using the ion implantation process and annealed using this invention may be higher than that available in any other ion implanted semiconductor material. In such a specific situation the sheet resistivity may be less than 350 $\Omega/\square$.

While applicants believe that subsequent to the annealing process, the tellurium takes up substitutional positions, some of the results are also consistent with the unlikely possibility that the tellurium is located in unique interstitial positions. They have however shown that the concentration of dopant in active sites, whether they are substitutional or interstitial, may be greater than that obtained in the prior art doping and annealing of GaAs. The low resistivity has lead applicants to conclude that the amount of evaporative loss of arsenic during the annealing process is minimal. Such loss is most likely no greater than that required to provide substitutional sites for the dopant.

2. METALLIC CONTACTS

Higher dopant concentrations allow for more efficient electrical connection to metal contacts. Normally, the positioning of such metal contacts on a semiconductor material results in the formation of a Schottky barrier which effectively prevents current flow through the contact when the contact is reverse biased. However, when the dopant concentration is elevated, as it may be in materials fabricated according to the teachings of this invention, the reverse breakdown voltage of the Schottky barrier drops. This is at least in part due to the fact that the depletion layer has become narrower than the tunnel length thereby permitting current flow to the contact. Prior to this invention, high concentration implantation which permitted metal contacts could not easily be effected by ion implantation, since such high concentrations resulted in damage so severe that it could not be readily annealed without evaporative loss (especially without a "cap").

ROOM TEMPERATURE IMPLANTATION

Ion implantation is more effectively utilized in the prior art when the substrate to be implanted is heated during the implantation process. Such heating limits the amount of damage and yields a structure which may be more easily annealed in the subsequent annealing step. Since this invention results in only minimal evaporative loss during annealing, room temperature implantation may now be more effectively practiced, since even room temperature implanted material may be annealed using this process. Any damage that occurs may be readily annealed without significant evaporation loss using the short term annealing process disclosed here.

While the broad embodiment of this invention envisions annealing through the utilization of short term energy deposition, this broad embodiment is not meant to exclude, in specific embodiments, the application of additional heat to further improve the annealing of the damaged semiconductor. For example, it may be desirable to heat the substrate during the short term energy deposition so as to remove any residual, albeit minimal, defects which may remain.

4. THE DOPANT DISTRIBUTION

Applicants have found that the center of the dopant distribution may tend to move inward during the annealing process rather than towards the surface. This, too, contributes to lower loss of the dopant during the annealing. In addition this opens the possibility of carefully controlling the depth of the implanted layer. The center of the dopant concentration may extend to a greater depth the longer the deposition pulse. This effect may be further stimulated by the application of a field to aid in the diffusion. In any event it is clear that buried layers may be fabricated at depths greater than 300 angstroms using this technique.

5. DEVICES

The annealing process described here may be applied to the fabrication of optical devices such as semiconductor lasers or light-emitting diodes. It is especially critical in these devices that the material be thoroughly annealed so that the electron hole pairs recombine radiatively rather than by nonradiative recombination. This annealing process may also be used in the fabrication of polycrystalline solar cells. The short term energy deposition technique minimizes dopant diffusion down the polycrystalline boundaries. Such diffusion normally limits the effectiveness of polycrystalline solar cells.

Both electrical and optical devices, fabricated according to the teachings of this invention, will normally have at least one electrical contact to the device. The electrical contact may be to the annealed region, but in specific devices the contact, or additional contacts, may be made to other regions of the structure. The contacts may be metallic contacts or may be effected by any other technique available in the art.

The semiconductor material subsequent to annealing may comprise two or more regions of differing conductivity type, magnitude, or combinations of type and magnitude. This broad definition is meant to include junction devices either bipolar or unipolar, of the type now used in the semiconductor art.

Figure 2:
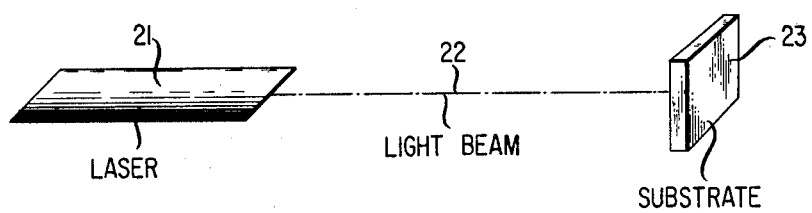
FIG. 2 is a schematic representation of a laser annealing apparatus.

FIGS. 1 and 2 are descriptive of specific embodiments of this invention. In this embodiment a semiconductor material is damaged during ion implantation and is annealed by means of a short term laser pulse. FIG. 1 is a schematic representation of an ion implantation device. These devices are well known in the art. The specifics of the device may vary depending upon the particular device and its particular application. However, these devices generally involve an accelerator, 11, which is used to form a beam of appropriate dopant atoms or molecules either ionic or neutral. A beam of dopant material, 12, impinges on a semiconductor, 13, and implants within this material at a depth of from hundreds to thousands of angstroms. The implantation results in significant damage to the crystal structure which is subsequently annealed using a laser pulse. As mentioned before, the invention, however, is not limited to the annealing of a damaged crystal but may also be advantageously used in annealing or crystallizing a totally amorphous material.

FIG. 2 is a schematic representation of the annealing apparatus. During the annealing process a laser 21 is used to direct radiation 22 of appropriate frequency onto a damaged crystal 23.

EXAMPLE 1

An n-type gallium arsenide substrate Si doped to a resistivity of $10^{-3}$ $\Omega$-cm was implanted with tellurium using the ion implantation and laser annealing process. 55 KeV tellurium ions were used to bombard the gallium arsenide substrate. The ion implantation dose was $7 \times 10^{15}$ Te/cm$^2$ and the size of the implanted region was 1 cm$^2$. The total implantation time was from 4–5 minutes. A laser was then used to anneal the damage that resulted from the ion implantation. A passively Q-switched ruby laser was used. The laser was operated to yield 12ns sec. pulses (full width, half maximum) with average energy of approximately 100 mj. The laser beam was 7mm in diameter and a single pulse was applied to the substrate. Subsequent to annealing, channeling measurements were made which determined that more than 90 percent of the tellurium was located at substitutional sites and that the concentration of tellurium was $10^{21}/cm^3$. This is to be compared with the solid solubility limit of $10^{19}/cm^3$. The tellurium concentration subsequent to implantation but prior to annealing is centered at about a 150 angstrom depth whereas, subsequent to annealing, the center of the tellurium distribution moves to about 300 angstroms, broadens by only a factor of two, and extends to a depth of about 600 angstroms. It is clear from these results that the laser is effective at least to 600 angstrom depths. No out-diffusion of the tellurium was observed during the annealing process.

EXAMPLE 2

In this example a diode was fabricated and appropriate measurements made upon it. A gallium arsenide substrate, p-doped with zinc to a resistivity of 0.004Ω-cm, was subsequently ion implanted with 60KeV tellurium ions to a concentration of $10^{16}/cm^2$. The sample was laser annealed as in the prior example. Four probe measurements of the sheet resistivity yielded a value of 300 ohms/□ (equivalent approximately to a resistivity of $10^{-3}$ohms-cm.). Diode measurements were made between the tellurium doped and zinc doped regions of gallium arsenide which yielded acceptable Iv characteristics given the large area annealed. The reverse breakdown voltage was measured to be 4.5V which is comparable to the substrate limited value. This indicates little weakening of the breakdown due to the implanted tellurium region.

What is claimed is:

1. A process comprising
    exposing at least a portion of the uncapped region of a damaged crystalline compound semiconductor material to short term localized energy deposition for a period less than 10 milliseconds thereby annealing the damaged crystal material to a substantially undamaged crystal state without substantial loss of compound semiconductor constituents occurring and
    providing electrical contact to at least one region of the semiconductor material.

2. The process of claim 1 wherein the damaged crystalline compound semiconductor material has a defect density greater than $10^{17}/cc$.

3. The process of claim 2 further comprising the step of ion implanting a dopant material into the compound semiconductor prior to annealing.

4. The process of claim 3 wherein the crystalline is damaged during ion implantation of the dopant material.

5. The process of claim 4 wherein the damaged material has a defect density greater than $10^{19}/cc$.

6. The process of claim 1 wherein the damaged material has a defect density greater than $10^{19}/cc$.

7. The process of claim 4 wherein the damaged material has a defect density greater than $10^{20}/cc$.

8. The process of claim 5 wherein the concentration of implanted material is greater than $10^{15}/cc$.

9. The process of claim 8 wherein the evaporative loss is less than $10^{15}/cc$.

10. The process of claim 4 wherein the energy is electromagnetic energy.

11. The process of claim 10 wherein the electromagnetic energy is within the optical range.

12. The process of claim 11 wherein the electromagnetic energy is laser radiation.

13. The process of claim 12 wherein the laser describes a pattern on the semiconductor material.

14. The process of claim 12 wherein the concentration of implanted material in the annealed semiconductor is greater than the solid solubility for such implanted material in the semiconductor.

15. The process of claim 12 wherein the sheet resistivity of the annealed semiconductor material is less than 350 ohms/□.

16. The process of claim 12 wherein a buried layer of implanted material is formed at depths greater than 300 angstroms.

17. The process of claim 12 wherein the laser is pulsed with a pulse width less than 10 milliseconds.

18. The process of claim 12 wherein the laser is a cw laser which scans the substrate thereby exposing a given region for a time period less than 10 milliseconds.

19. The process of claim 1 wherein the substrate consists of at least two regions of different conductivity type.

20. The process of claim 19 wherein an electrical contact is made to at least one of the at least two conductivity regions in the substrate material.

21. The process of claim 1 wherein the annealed material has a mobility greater than 10 cm$^2$/Volt-sec.

22. The process of claim 21 wherein the annealed material has a mobility greater than 50 cm$^2$/Volt-sec.

23. The process of claim 1 further comprising placing a metal contact upon the annealed semiconductor structure.

24. The process of claim 1 whereby a light-emitting diode is formed.

25. The process of claim 1 whereby a semiconductor laser is formed.

26. The process of claim 1 wherein the compound semiconductor has more than two constituents.

27. The process of claim 1 wherein the compound semiconductor is a binary.

28. The process of claim 4 wherein the compound semiconductor is gallium arsenide.

29. The process of claim 4 wherein the compound semiconductor is a binary.

30. The process of claim 28 wherein the dopant is tellurium.

31. The process of claim 17 wherein the laser is pulsed with a pulse width less than 1 nanoseconds.

32. The process of claim 1 wherein a solar cell is formed.

33. The process of claim 1 wherein the damaged crystalline compound semiconductor material is an amorphous material.

* * * * *